(12) United States Patent
Park et al.

(10) Patent No.: US 10,522,665 B2
(45) Date of Patent: Dec. 31, 2019

(54) SEMICONDUCTOR CIRCUIT USING POSITIVE FEEDBACK FIELD EFFECT TRANSISTOR FOR EMULATING NEURON FIRING PROCESS

(71) Applicant: Seoul National University R&DB FOUNDATION, Seoul (KR)

(72) Inventors: Byung-Gook Park, Seoul (KR); Min-Woo Kwon, Seoul (KR); Sungmin Hwang, Seoul (KR); Myung-Hyun Baek, Seoul (KR); Tae-Jin Jang, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 0 days.

(21) Appl. No.: 16/007,120

(22) Filed: Jun. 13, 2018

(65) Prior Publication Data

US 2018/0374938 A1 Dec. 27, 2018

(30) Foreign Application Priority Data

Jun. 22, 2017 (KR) .......................... 10-2017-0079213

(51) Int. Cl.
*H03K 17/687* (2006.01)
*H01L 29/739* (2006.01)
(Continued)

(52) U.S. Cl.
CPC ........... *H01L 29/7393* (2013.01); *G06N 3/10* (2013.01); *H01L 29/0847* (2013.01);
(Continued)

(58) Field of Classification Search
CPC ....... H01L 2924/00; H01L 2224/48227; H01L 2224/73265; H01L 29/7869; G09G 2300/0842
See application file for complete search history.

(56) References Cited

U.S. PATENT DOCUMENTS

| 5,838,173 A * | 11/1998 | Oh | ................... G01R 19/16552 327/77 |
| 2013/0009623 A1* | 1/2013 | Birk | ..................... H03K 17/063 323/315 |

FOREIGN PATENT DOCUMENTS

KR 10-1528802 6/2015

OTHER PUBLICATIONS

Frontiers in Neuroscience, vol. 5, Article 73, May 2011.

* cited by examiner

*Primary Examiner* — Sibin Chen
(74) *Attorney, Agent, or Firm* — Gerald E. Hespos; Michael J. Porco; Matthew T. Hespos

(57) ABSTRACT

Semiconductor circuits are provided for emulating neuron firing process using a positive feedback transistor having first and second gate electrodes in the longitudinal direction of a channel region. The first gate electrode is connected to a gate electrode of a first p-channel MOSFET to be an input terminal and the second gate electrode is connected to a drain to be applied with a supply voltage. Thus electrons and holes can accumulate separately in a channel region (i.e., a body) under each of the gate electrodes by applying input signals to the input terminal and drastically reduce the wasted power consumption in the non-fired neurons because the current is turned on and off only at a moment that corresponds to a firing of the neuron. Thus, the semiconductor circuits can be driven by low power and have the same level of endurance as a general MOSFET.

11 Claims, 8 Drawing Sheets

(51) Int. Cl.
    *H01L 29/08*         (2006.01)
    *H01L 29/10*         (2006.01)
    *G06N 3/10*          (2006.01)
    H01L 29/423      (2006.01)
    H03K 3/012       (2006.01)

(52) U.S. Cl.
    CPC ...... *H01L 29/1033* (2013.01); *H03K 17/6872* (2013.01); *H01L 29/4238* (2013.01); *H03K 3/012* (2013.01)

US 10,522,665 B2

SEMICONDUCTOR CIRCUIT USING POSITIVE FEEDBACK FIELD EFFECT TRANSISTOR FOR EMULATING NEURON FIRING PROCESS

CROSS-REFERENCE TO RELATED APPLICATION

This application claims priority to Korean Patent Application No. 10-2017-0079213, filed on Jun. 22, 2017, under 35 U.S.C. 119, the entire contents of which are hereby incorporated by reference.

BACKGROUND

Field of the Invention

The present invention relates to semiconductor circuits, and more particularly to semiconductor circuits for emulating a neuron firing process using a positive feedback field effect transistor (FBFET).

Description of the Related Art

The nervous system of a living body is consisted of numerous nerve cell neurons and synapses connecting neurons. Thus, external stimulations are converted into electrical signals in the living body and the signals are transmitted into each nervous system in the form of action potentials through neurons. When the action potentials generated from pre-synaptic neurons pass through the synapses, they become small-sized post-synaptic potentials. When the various post-synaptic potentials are integrated to exceed a certain value (i.e., a threshold), a new action potential is generated at the axon hillock of the post-synaptic neuron. By such a way, the action potentials are transmitted. For more details, refer to Korean Patent No. 10-1528802 by the same inventor.

Recently, many studies have been made to mimic the nervous system of a living body, in particular the brain nervous system, by a nerve-like circuit system (i.e., a neuromorphic computation system) using semiconductor devices. Neuron circuits, namely, semiconductor circuits for emulating a neuron firing process can be said to be a key element of the neuromorphic computation system. It is the greatest task to increase the degree of integration and to reduce energy consumption.

The Korean Patent No. 10-1528802 has an advantage that the area of the neuron mimetic circuit can be drastically reduced by using a floating body device instead of the conventional capacitor as shown in FIG. 1. However, when holes formed by impact ionization are stored in the floating body, a relatively high supply voltage is required and there are disadvantages in terms of endurance of the device.

FIG. 2 is an axon-hillock circuit based on a conventional capacitor and FIG. 3 is an electrical output characteristic diagram of FIG. 2 (Giacomo Indiveri et al., Neuromorphic silicon neuron circuits, Frontiers in Neuroscience, Vol. 5, Article 73, May 2011).

According to FIG. 2, a current pulse is received at an input and stored in a capacitor Cmem. When the potential of Cmem exceeds the switching voltage of the subsequent amplifier (A) comprising two inverters formed in series, an output Vout is generated. The signal is transmitted to the next subsequent neuron and Cmem is discharged. At this time, even when the potential stored in Cmem is smaller than the switching voltage, the current continues to flow to the subsequent amplifier A. So it causes a problem that power consumption becomes very large when the neuron is not fired.

SUMMARY

The present invention is to provide semiconductor circuits for emulating a neuron firing process using a positive feedback transistor. In the present invention, the positive feedback transistor has two gates in series to perform a neuron firing process with low power and to minimize power consumption when the neuron circuit is fired or not.

To achieve the objectives, a semiconductor circuit for emulating a neuron firing process according to the present invention comprises a positive feedback transistor and a first n-channel MOSFET connected in parallel between a ground and a first node; a first p-channel MOSFET connected between the first node and an electric power supply line; and an inverter connected between the first node and an output terminal, wherein a first gate electrode of the positive feedback transistor is connected to a gate electrode of the first p-channel MOSFET to be an input terminal, and wherein a second gate electrode of the positive feedback transistor is connected to the first node to apply the supply voltage of the electric power supply line.

Here, an input voltage may be applied between the electric power supply line and the input terminal, and the output terminal may be connected to a gate electrode of the first n-channel MOSFET.

A gate electrode of the first n-channel MOSFET may be connected to the input terminal, a second p-channel MOSFET may be connected between the electric power supply line and the input terminal, a gate electrode of the second p-channel MOSFET may be connected to the first node, a second n-channel MOSFET may be connected between the input terminal and the ground, and a gate electrode of the second n-channel MOSFET may be connected to the output terminal.

An input current may be applied between the electric power supply line and the input terminal, and a capacitor and a resister may be connected in parallel between the input terminal and the ground.

The positive feedback transistor may have source and drain regions formed of a different conductivity type with a channel region therebetween in a semiconductor substrate, and the first and second gate electrodes may be configured in the longitudinal direction of the channel region near to the source and drain regions, respectively, on a gate insulator.

The source region may be n-type, the drain region may be p-type, the channel region may be p-type and intrinsic under the first and second gate electrodes, respectively, and the positive feedback transistor may have a doping structure of P+IPN+ from the drain region.

The present invention comprises a positive feedback transistor having first and second gate electrodes in the longitudinal direction of a channel region, wherein the first gate electrode is connected to a gate electrode of a first p-channel MOSFET to be an input terminal and the second gate electrode is connected to a drain to be applied with a supply voltage. And the present invention can separately accumulate electrons and holes in a channel region (i.e., a body) under each of gate electrodes by applying input signals to the input terminal and drastically reduce the wasted power consumption in the non-fired neurons because of the current turned on and off only at a moment when it corresponds to a firing of the neuron. Thus, the present invention can be driven by low power and have the same level of endurance as a general MOSFET.

In these drawings, the following reference numbers are used throughout: reference number 10 indicates a source region, 20 a drain region, 30, 32, 34 a channel region (i.e., a body), 40 a gate insulator, 52 a first gate electrode, 54 a second gate electrode, 110 a positive feedback transistor, 120 a first n-channel MOSFET, 130 a first p-channel MOSFET, 140 an inverter, 150 an electric power supply line, 160 a second n-channel MOSFET, 170 a second p-channel MOSFET, 180 a capacitor and 190 a resistor.

DETAILED DESCRIPTION

Detailed descriptions of preferred embodiments of the present invention are provided below with reference to accompanying drawings. The structures or the electrical characteristic diagrams of exemplified devices and circuits in the accompanying drawings are provided to explain the technical idea of the present invention in order to understand a person with ordinary skill in the art to which the present invention pertains, thus, the technical idea of the present invention should not be restricted to the described embodiments herein.

Figure 1:
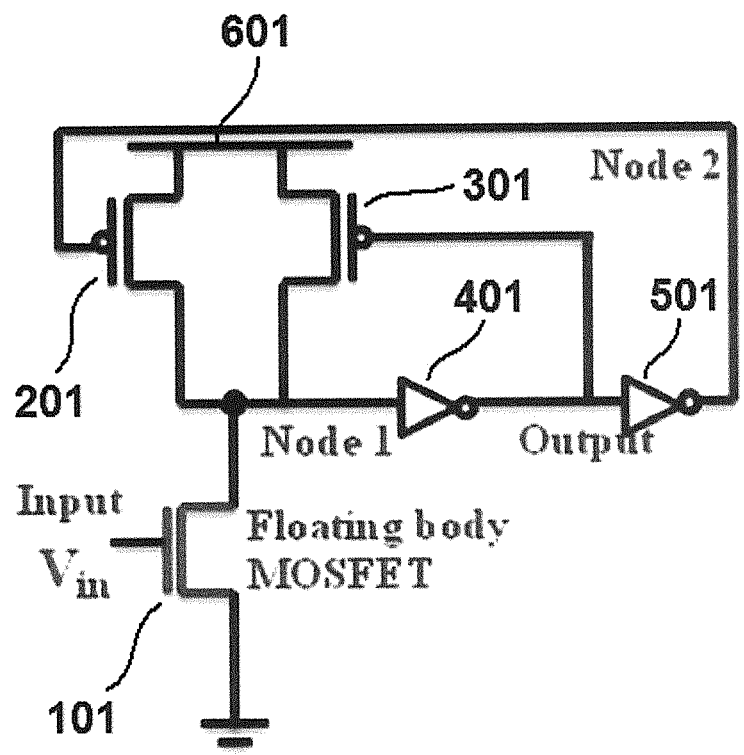
FIG. 1 is a diagram showing a configuration of a semiconductor circuit using a floating body device for emulating a neuron firing process as an embodiment disclosed in Korean Patent No. 10-1528802.
Figure 2:
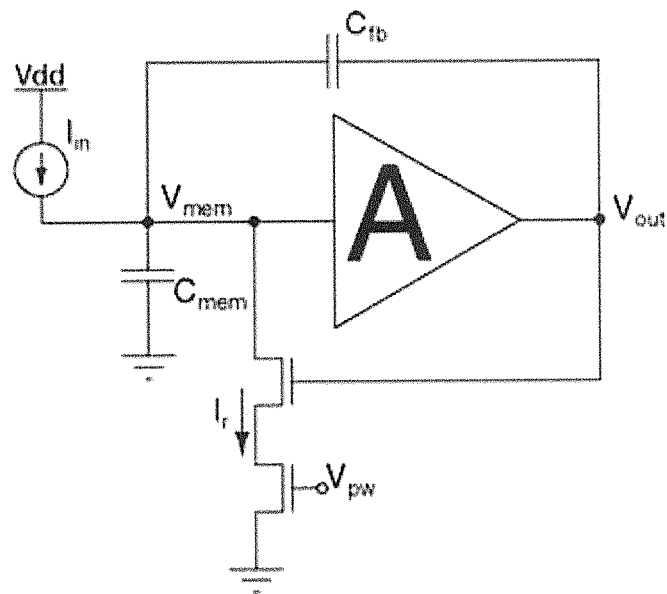
FIG. 2 is a diagram showing a configuration of an axon-hillock circuit based on a conventional capacitor.
Figure 3:
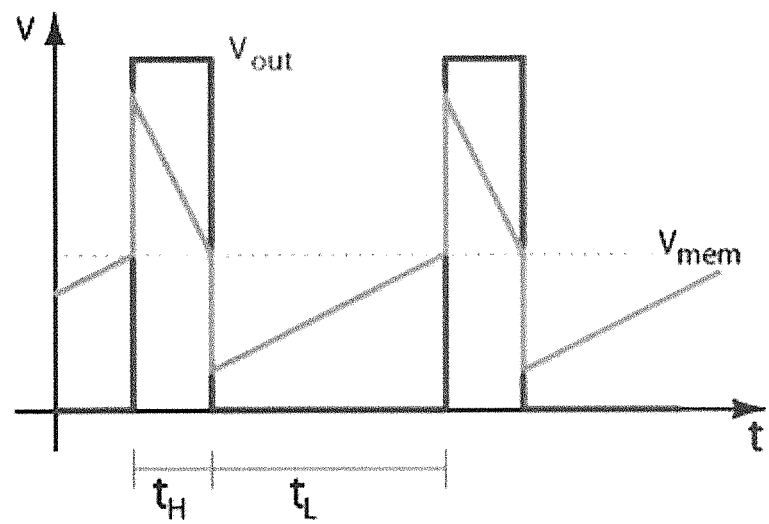
FIG. 3 is an electrical output characteristic diagram of FIG. 2.
Figure 4:
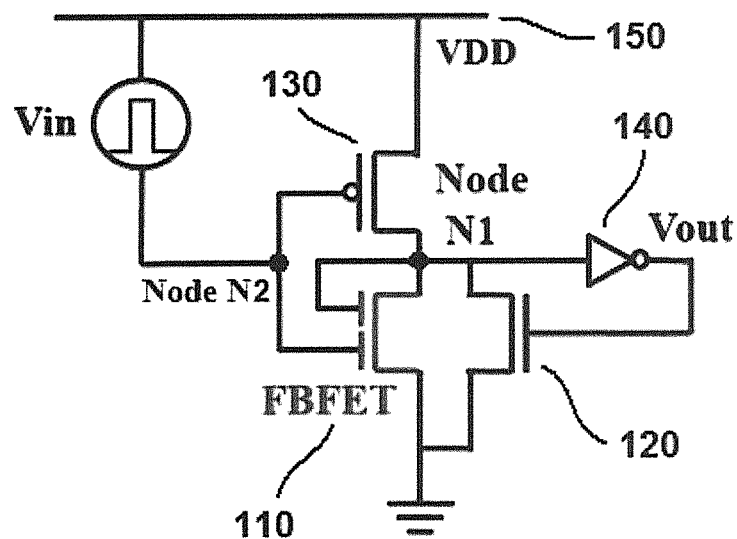
FIG. 4 is a diagram showing a configuration of a semiconductor circuit for emulating a neuron firing process according to one embodiment of the present invention.

A semiconductor circuit for emulating a neuron firing process according to an embodiment of the present invention, as shown in FIG. 4, comprises: a positive feedback transistor 110 and a first n-channel MOSFET 120 connected in parallel between a ground GND and a first node Node N1; a first p-channel MOSFET 130 connected between the first node Node N1 and an electric power supply line 150; and an inverter 140 connected between the first node Node N1 and an output terminal Vout, wherein a first gate electrode of the positive feedback transistor 110 is connected to a gate electrode of the first p-channel MOSFET 130 to be an input terminal Node N2, and wherein a second gate electrode of the positive feedback transistor 110 is connected to the first node Node N1 to apply the supply voltage $V_{DD}$ of the electric power supply line 150.

Figure 12:
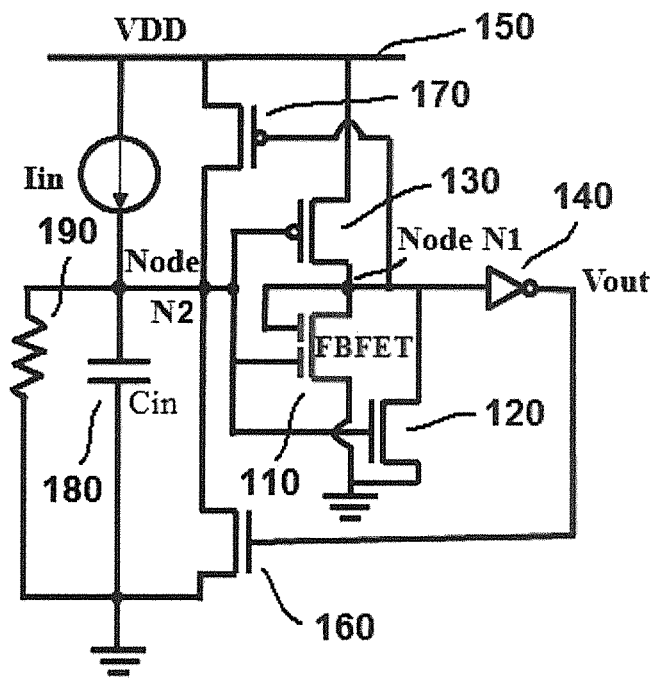
FIG. 12 is a diagram showing a configuration of a semiconductor circuit or emulating a neuron firing process according to another embodiment of the present invention.
Figure 13:
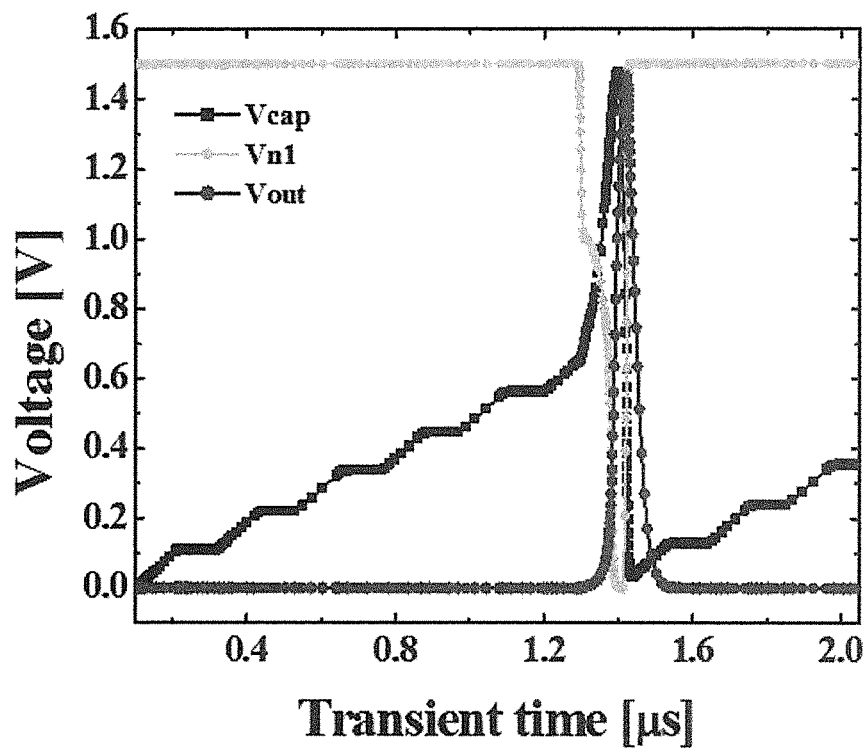
FIGS. 13 to 15 are diagrams gained from simulations of a semiconductor circuit for emulating a neuron firing process of FIG. 12.

Here, an input signal Vin corresponding to the post-synaptic potential may be applied between the electric power supply line 150 and the input terminal Node N2. The post-synaptic potentials are transmitted into the axon hillock of a post-synaptic neuron through each of synapses and integrated as an action potential. Such the input signal may be an electric power of an input voltage having a pulse waveform as shown in FIG. 4 or may be an electric power of an input current as shown in FIG. 12. In the latter case, a capacitor Cin 180 and a resistor 190 may be further connected in parallel between the input terminal Node N2 and the ground GND so that the voltage Vcap of the input terminal Node N2 has a triangular waveform as a whole as shown in FIG. 13.

Figure 5:
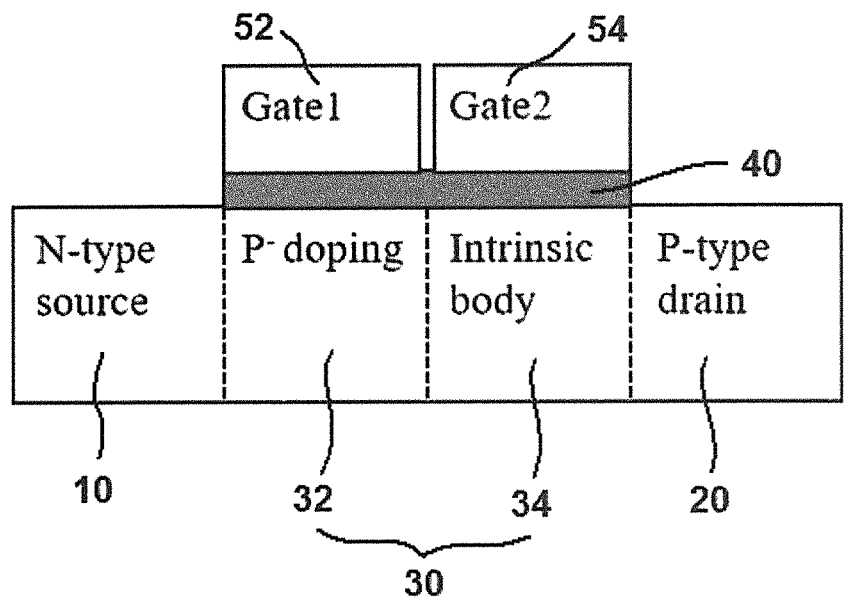
FIG. 5 is a cross-sectional view showing a structure of a positive feedback transistor according to one embodiment of the present invention.

The positive feedback transistor 110, as shown in FIG. 5, may have source 10 and drain regions 20 formed of a different conductivity type with a channel region 30 therebetween in a semiconductor substrate, and the first 52 and second gate electrodes 54 may be configured in the longitudinal direction of the channel region 30 near to the source 10 and drain regions 20, respectively, on a gate insulator 40.

The channel region 30, as a body for forming a channel, under the first and second gate electrodes 52 and 54 can be formed of an intrinsic semiconductor without any distinction or have the same conductive type as the source 10 or drain region 20. In the latter case, the channel region 30 may have a lower doping concentration than the source 10 or drain region 20. However, as shown in FIG. 5, it is preferable that in the channel region 30 one part 32 under the first gate electrode 52 near to the source region 10 has the same conductive type as the drain region 20 and the other part 34 under the second gate electrode 54 near to the drain region 20 is intrinsic. Thus, an active region of the positive feedback transistor 110 can have a doping structure of P+IPN+.

For an embodiment, as shown in FIG. 5, the source region 10 may be n-type, the drain 20 region may be p-type and in the channel region 30 the lower region 32 under the first gate electrode 52 may be p-type and the lower region 34 under the second gate electrode 54 may be intrinsic so that the positive feedback transistor 110 has a doping structure of P+IPN+ from the drain region 20.

And, as shown in FIG. 5, the gate insulator 40 can be also formed, without any distinction under the first and second gate electrodes 52 and 54, of the same insulating material with the same thickness. However, when the channel region 30 is formed of an intrinsic semiconductor and/or a doped semiconductor having a doping concentration lower than the source 10 or drain region 20, it is preferable that the gate insulator 40 is configured to have a different dielectric constant or a different thickness under the first and second gate electrodes 52 and 54 according to the channel region 30.

Figure 6:
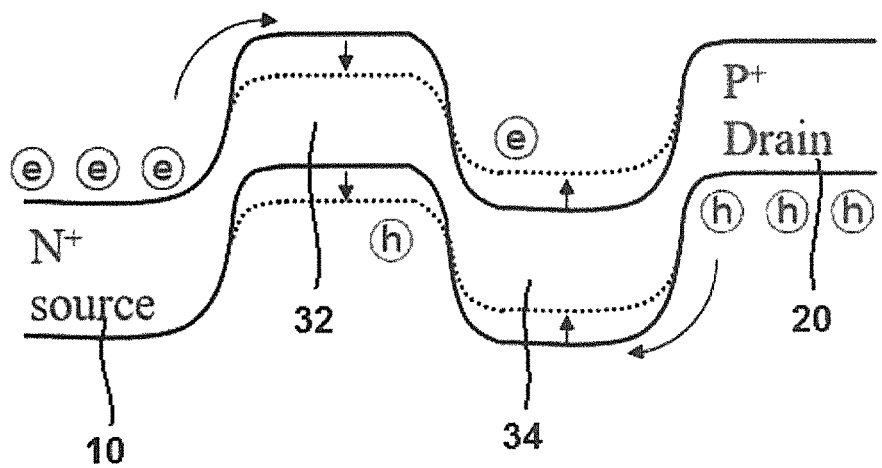
FIG. 6 is an energy band diagram for the positive feedback transistor of FIG. 5.

FIG. 6 is an energy band diagram for the positive feedback transistor 110 of FIG. 5. Referring to FIGS. 4 to 6, the operation of the positive feedback transistor 110 according to the present invention is briefly described below.

A pulsed input voltage Vin is applied to the first gate electrode 52 of the positive feedback transistor 110 through the input terminal Node N2 and a supply voltage $V_{DD}$ of the electric power supply line 150 is applied to the second gate electrode 54 connected to the first node Node N1 together with the drain region 20.

Therefore, when the input voltage Vin is a low state, the first p-channel MOSFET 130 is turned on so that the input voltage Vin of the low state and the supply voltage $V_{DD}$ are applied to the first and second gate electrodes 52 and 54, respectively. Thus, the P+IPN+ active region shows the energy bands of the solid lines in FIG. 6. When the input voltage Vin is changed to a high state, the first p-channel MOSFET 130 is turned off so that the input voltage Vin of the high state and the pre-charged voltage are applied to the first and second gate electrodes 52 and 54, respectively. Thus, the P+IPN+ active region shifts to the energy bands of the dotted lines in FIG. 6.

When the input voltage Vin of the high state is applied to the first gate electrode 52, the channel region 32 under the first gate electrode 52 decreases a conduction band barrier, that is, an electron barrier at the side of the source region 10 decreases. So that electrons in the conduction band of the source region 10 move to the conduction band of the intrinsic semiconductor of the channel region 34 under the second gate electrode 54 and accumulate in the channel region 34 under the second gate electrode 54. Thus, by the effects of the accumulated electrons, the energy bands of the channel region 34 under the second gate electrode 54 are gradually shifted up as shown by the dotted lines in FIG. 6.

On the other hand, by the effects of the electrons accumulated in the channel region 34 under the second gate electrode 54, the hole barrier at the side of the drain region 20 is decreased, that is, the valance band barrier of the intrinsic semiconductor 34 under the second gate electrode 54 is decreased. So that the holes move from the drain region 20, pass through the valance band barrier of the intrinsic semiconductor 34, move to the valance band of the p-doped region of the channel region 32 under the first gate electrode 52 and accumulate in the channel region 32 under the first gate electrode 52. By the effects of the accumulated holes, the energy bands of the channel region 32 under the first gate electrode 52 are gradually shifted down as shown by the dotted lines in FIG. 6.

Figure 7:
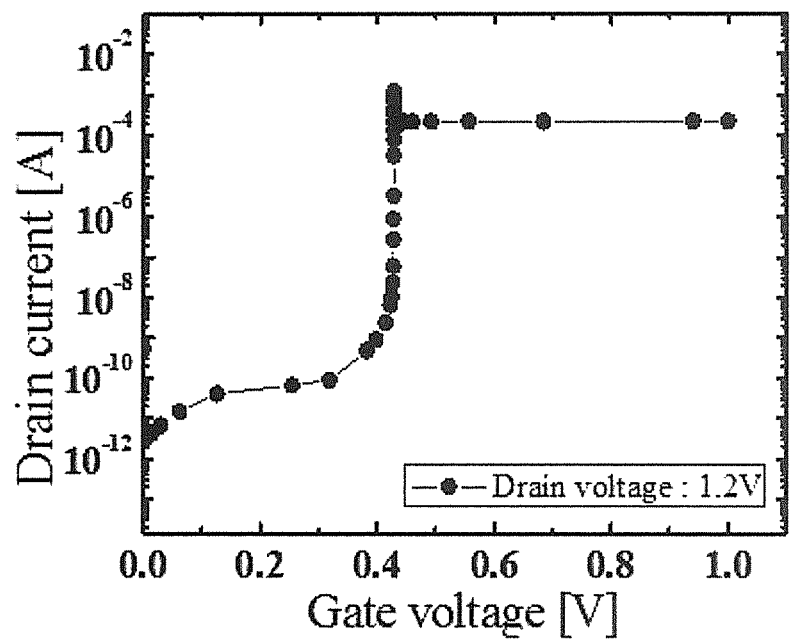
FIG. 7 is an electrical characteristic diagram for the positive feedback transistor of FIG. 5.

Electrons and holes passed through each barrier can further decrease the energy barriers. By such positive feedback, electrons and holes are rapidly increased in the respective channel regions 32 and 34. When a specific threshold point of the device is reached, the positive feedback transistor 110 is turned on and the current rapidly increases as shown in FIG. 7.

Next, when the positive feedback transistor 110 is turned on, as an embodiment in FIG. 4, the voltage Vn1 of the first node Node N1 drops to the ground voltage (0), and the output terminal Vout passing through the inverter 140 rises to the supply voltage $V_{DD}$.

By doing so, when multiple post-synaptic potentials are integrated at the axon hillock of a neuron to exceed a predetermined threshold, it is possible to emulate the firing as a new action potential.

On the other hand, in order to emulate returning to the original membrane electric potential after being fired at the axon hillock, it is preferably that the first n-channel MOSFET 120 is connected to the positive feedback transistor 110 in parallel between the ground GND and the first node Node N1 and the gate electrode of the first n-channel MOSFET 120 is connected to the output terminal Vout as shown in the embodiment of FIG. 4.

By doing so, when the output terminal Vout rises to the value of the supply voltage $V_{DD}$, the first n-channel MOSFET 120 is turned on. So the voltage Vn1 of the first node Node N1 is returned to a voltage state before the pre-charged state. And when the low state of the next pulsed input voltage Vin is applied to the gate electrode of the first p-channel MOSFET 130 and the first gate electrode 52 of the positive feedback transistor 110, the first p-channel MOSFET 130 is turned on again. Thus, the voltage Vn1 of the first node Node N1 immediately returns to the supply voltage $V_{DD}$ and the output terminal Vout drops to the zero (0) state immediately after the fire.

Figure 8:
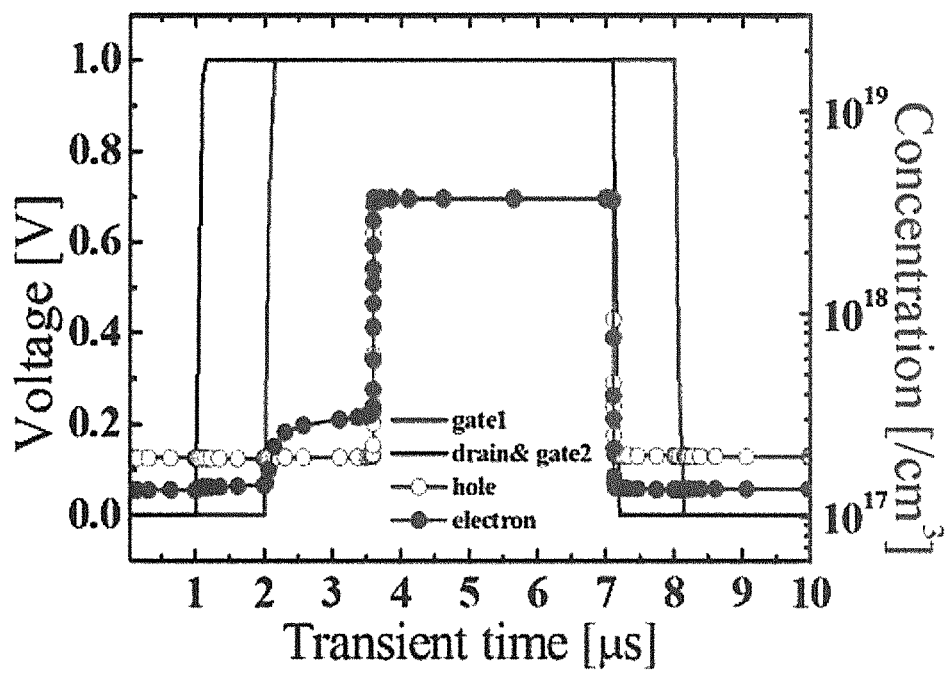
FIG. 8 is a simulation diagram showing the voltage applied to each of the gates and the change in concentration of electrons and holes accumulated in the channel region (i.e., the body) according to transient time in the positive feedback transistor of FIG. 5.

FIG. 8 is a simulation diagram showing the applied voltages of each of the gates 52 and 54 and the change in concentration of electrons and holes accumulated in each of the channel regions 32 and 34 in a body according to transient time before and after the fire in the positive feedback transistor 110 of FIG. 5.

Figure 9:
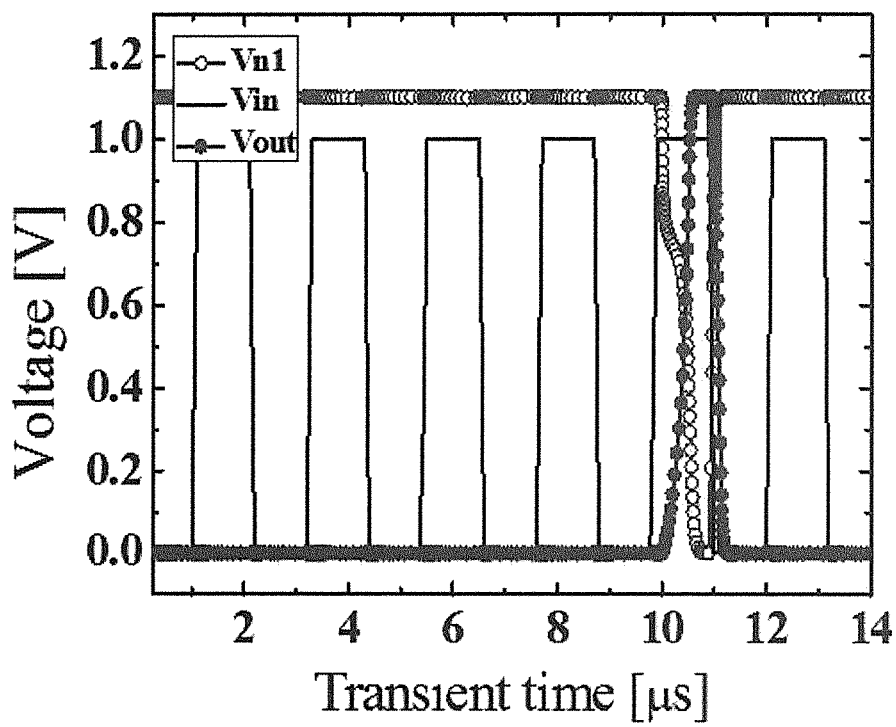
FIGS. 9 to 11 are diagrams gained from simulations of a semiconductor circuit for emulating a neuron firing process of FIG. 4.

FIG. 9 is a diagram gained from a simulation of the embodiment of FIG. 4 showing the relationships among the pulsed input voltage Vin, the voltage Vn1 of the first node Node N1 and the output terminal voltage Vout.

Figure 10:
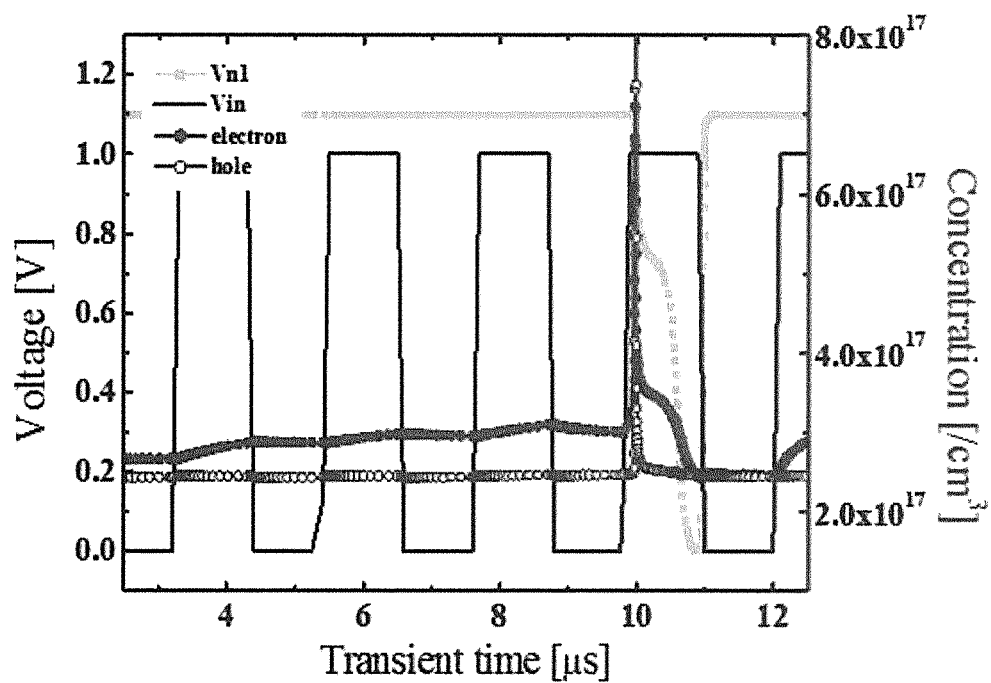
Figure 11:
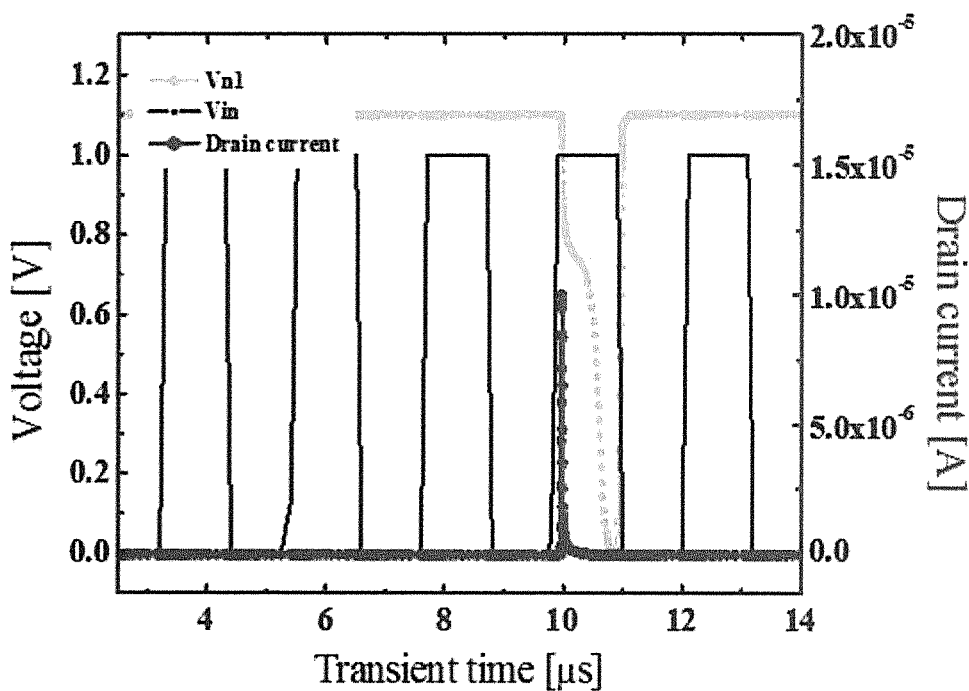

FIG. 10 is a diagram gained from a simulation of the embodiment of FIG. 4 showing the voltage Vn1 of the first node Node N1 and the concentration of the electrons and holes accumulated in each of the channel regions 32 and 34 when the pulsed input voltage Vin is applied. FIG. 11 is a diagram gained from a simulation of the same embodiment and shows that the drain current of the positive feedback transistor 110 flows only at a moment (that is, only when the holes suddenly increase and disappear as referred to FIG. 10).

From FIGS. 9 and 11, it can be seen that when the neuron circuit is constructed by the embodiment of FIG. 4, there is almost no electric power waste when the neuron is not fired.

In another embodiment, when the gate electrode of the first n-channel MOSFET 120 is connected to the input terminal Node N2 as shown in FIG. 12, a second n-channel MOSFET 160 is further connected between the input terminal Node N2 and the ground GND and the output terminal Vout is connected to the gate electrode of the second n-channel MOSFET 160. So, when the voltage Vout of the output terminal is increased by firing at the axon hillock, it can be constructed that the second n-channel MOSFET 160 is turned on and then the voltage Vcap of the input terminal Node N2 drops to zero (0) voltage.

By doing so, when the voltage Vcap of the input terminal Node N2 drops to zero (0), the first p-channel MOSFET 130 can be turned on and the voltage Vn1 of the first node Node N1 can be equal to the supply voltage $V_{DD}$. Thus, the output terminal Vout can drop to the zero (0) state to maintain the original membrane electric potential state.

On the other hand, when the voltage of the output terminal Vout is increased to the pulse waveform by firing at the axon hillock, the voltage Vn1 of the first node Node N1 must be kept at zero (0) state for a while. Thus, it is preferable that a second p-channel MOSFET 170 is further connected between the electric power supply line 150 and the input terminal Node N2 and that the gate electrode of the second p-channel MOSFET 170 is connected to the first node Node N1. By doing so, while the voltage Vn1 of the first node Node N1 is zero (0) state, the second p-channel MOSFET 170 is turned on and causes the voltage Vcap of the input terminal Node N2 to be equal to the supply voltage $V_{DD}$. Then, the first n-channel MOSFET 120 is turned on so that the voltage Vn1 of the first node Node N1 is kept the zero (0) state.

The moment keeping the voltage Vn1 of the first node Node N1 at the zero (0) state is till the voltage Vcap of the input terminal Node N2 is dropped again to zero (0). The latter happens at a time that the second n-channel MOSFET 160 is turned on by the high voltage of the output terminal Vout due to a next fire.

FIG. 13 is a diagram gained from a simulation of an embodiment of FIG. 12 showing the relationship among the voltage Vcap of the input terminal Node N2, the voltage Vn1 of the first node Node N1 and the voltage Vout of the output terminal.

Figure 14:
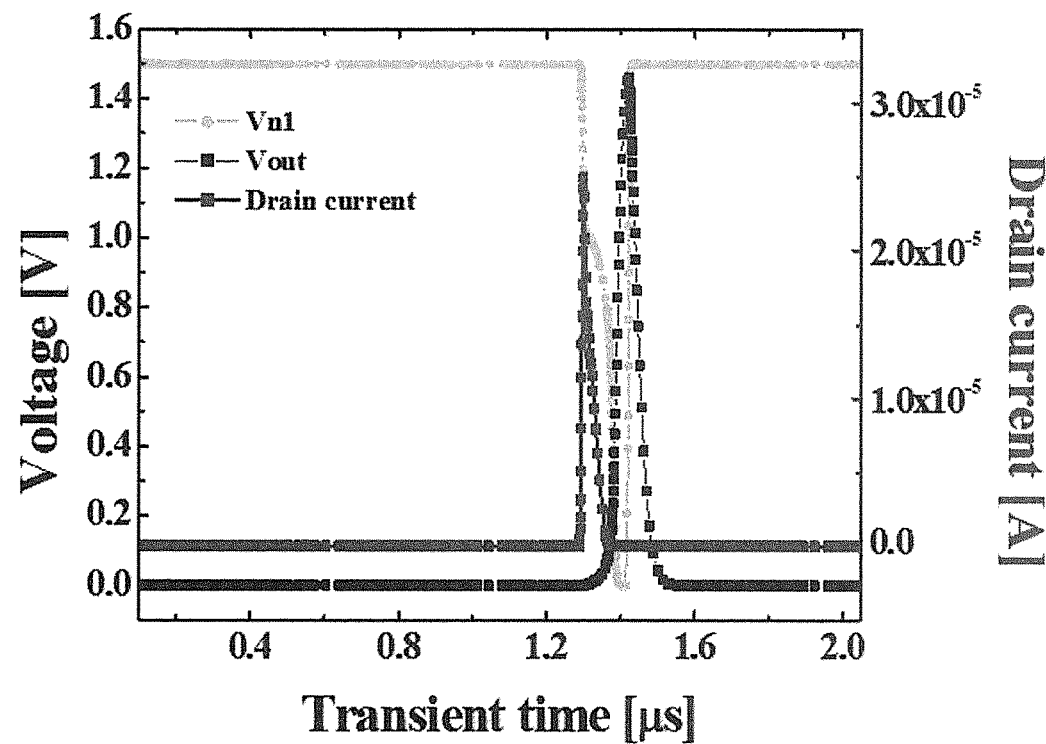

FIG. 14 is a diagram gained from a simulation of an embodiment of FIG. 12 showing the relationship among the voltage Vn1 of the first node Node N1, the drain current of the positive feedback transistor 110 and the voltage Vout of the output terminal when an input current fin is applied.

Figure 15:
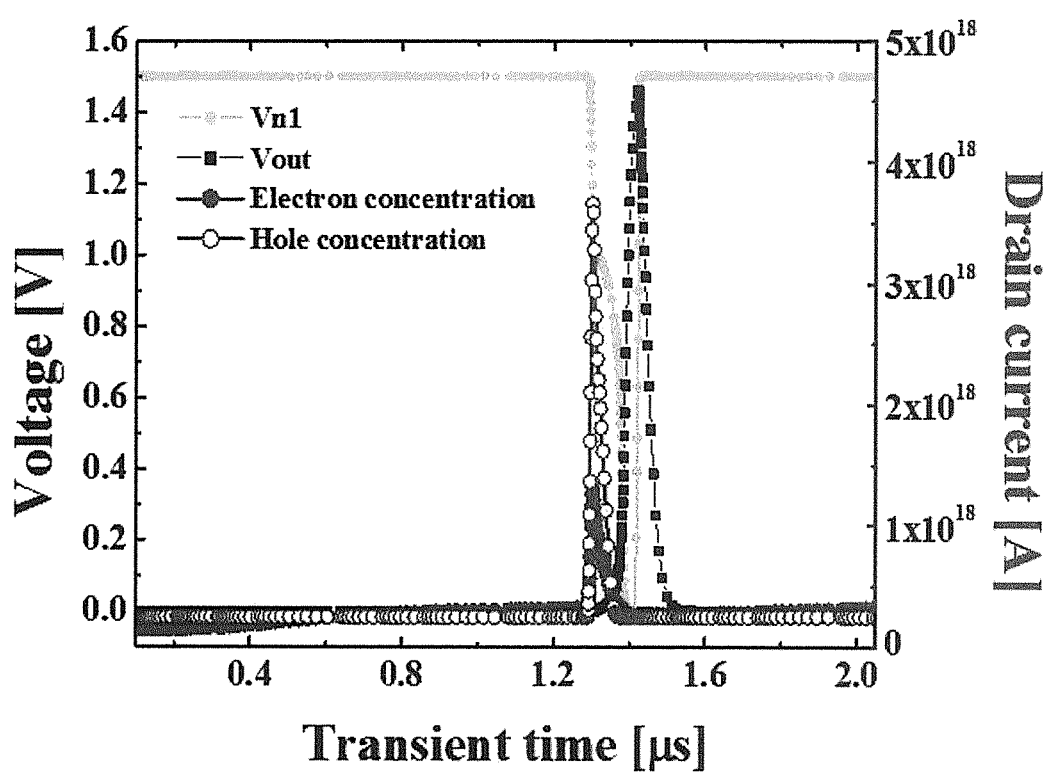

FIG. 15 is a diagram gained from a simulation of an embodiment of FIG. 12 showing the voltage Vout of the output terminal and the concentration of the electrons and holes accumulated in each of the channel regions 32 and 34.

Referring to FIGS. 14 and 15, in the case of the embodiment of FIG. 12, the drain current of the positive feedback transistor 110 can be seen only at a moment when the holes suddenly increase and disappear. It can be informed from this that it is possible to effectively emulate the firing process at the axon hillock without wasting unnecessary electric power.

What is claimed is:

1. A semiconductor circuit for emulating neuron firing process comprising:
a positive feedback transistor and a first n-channel MOSFET connected in parallel between a ground and a first node;
a first p-channel MOSFET connected between the first node and an electric power supply line; and
an inverter connected between the first node and an output terminal, wherein
a first gate electrode of the positive feedback transistor is connected to a pate electrode of the first p-channel MOSFET to be an input terminal,
a second gate electrode of the positive feedback transistor is connected to the first node to apply the supply voltage of the electric power supply line, and
an input voltage is applied between the electric power supply line and the input terminal, and the output terminal is connected to a gate electrode of the first n-channel MOSFET.

2. The semiconductor circuit of claim 1, wherein the positive feedback transistor has source and drain regions formed of a different conductivity type with a channel region therebetween in a semiconductor substrate, and the first and second gate electrodes are configured in the longitudinal direction of the channel region near to the source and drain regions, respectively, on a gate insulator.

3. The semiconductor circuit of claim 2, wherein the source region is n-type, the drain region is p-type, the channel region are p-type and intrinsic under the first and second gate electrodes, respectively, and the positive feedback transistor has a doping structure of P+IPN+ from the drain region.

4. A semiconductor circuit for emulating neuron firing process comprising:
a positive feedback transistor and a first n-channel MOSFET connected in parallel between a ground and a first node;
a first p-channel MOSFET connected between the first node and an electric power supply line; and
an inverter connected between the first node and an output terminal, wherein a first gate electrode of the positive feedback transistor is connected to a pate electrode of the first p-channel MOSFET to be an input terminal,
a second gate electrode of the positive feedback transistor is connected to the first node to apply the supply voltage of the electric power supply line,
a gate electrode of the first n-channel MOSFET is connected to the input terminal,
a second p-channel MOSFET is connected between the electric power supply line and the input terminal,
a gate electrode of the second p-channel MOSFET is connected to the first node, a second n-channel MOSFET is connected between the input terminal and the ground, and
a gate electrode of the second n-channel MOSFET is connected to the output terminal.

5. The semiconductor circuit of claim 4, wherein an input current is applied between the electric power supply line and the input terminal, and a capacitor and a resister are connected in parallel between the input terminal and the ground.

6. The semiconductor circuit of claim 5, wherein the positive feedback transistor has source and drain regions formed of a different conductivity type with a channel region therebetween in a semiconductor substrate, and the first and second gate electrodes are configured in the longitudinal direction of the channel region near to the source and drain regions, respectively, on a gate insulator.

7. The semiconductor circuit of claim 6, wherein the source region is n-type, the drain region is p-type, the channel region are p-type and intrinsic under the first and second gate electrodes, respectively, and the positive feedback transistor has a doping structure of P+IPN+ from the drain region.

8. The semiconductor circuit of claim 4, wherein the positive feedback transistor has source and drain regions formed of a different conductivity type with a channel region therebetween in a semiconductor substrate, and the first and second gate electrodes are configured in the longitudinal direction of the channel region near to the source and drain regions, respectively, on a gate insulator.

9. The semiconductor circuit of claim 8, wherein the source region is n-type, the drain region is p-type, the channel region are p-type and intrinsic under the first and second gate electrodes, respectively, and the positive feedback transistor has a doping structure of P+IPN+ from the drain region.

10. A semiconductor circuit for emulating neuron firing process comprising:
a positive feedback transistor and a first n-channel MOSFET connected in parallel between a ground and a first node;
a first p-channel MOSFET connected between the first node and an electric power supply line; and
an inverter connected between the first node and an output terminal, wherein
a first gate electrode of the positive feedback transistor is connected to a gate electrode of the first p-channel MOSFET to be an input terminal,
a second gate electrode of the positive feedback transistor is connected to the first node to apply the supply voltage of the electric power supply line,
the positive feedback transistor has source and drain regions formed of a different conductivity type with a channel region therebetween in a semiconductor substrate, and the first and second gate electrodes are configured in the longitudinal direction of the channel region near to the source and drain regions, respectively, on a gate insulator.

11. The semiconductor circuit of claim 10, wherein the source region is n-type, the drain region is p-type, the channel region are p-type and intrinsic under the first and second gate electrodes, respectively, and the positive feedback transistor has a doping structure of P+IPN+ from the drain region.

* * * * *